(12) United States Patent
Benato

(10) Patent No.: US 8,978,986 B2
(45) Date of Patent: Mar. 17, 2015

(54) PROCESS FOR MANUFACTURING A CONTACTLESS SMARTCARD HAVING A TRANSPARENT LOGO

(71) Applicant: Ask S.A., Sophia Cedex (FR)

(72) Inventor: Pierre Benato, Roquefort les Pins (FR)

(73) Assignee: Ask S.A., Sophia Antipolis (FR)

( * ) Notice: Subject to any disclaimer, the term of this patent is extended or adjusted under 35 U.S.C. 154(b) by 0 days.

(21) Appl. No.: 14/047,170

(22) Filed: Oct. 7, 2013

(65) Prior Publication Data

US 2014/0097253 A1    Apr. 10, 2014

(30) Foreign Application Priority Data

Oct. 5, 2012   (FR) ...................... 12 02671

(51) Int. Cl.
  *G06K 19/06*   (2006.01)
  *G06K 19/077*   (2006.01)
  *B42D 25/00*   (2014.01)

(52) U.S. Cl.
  CPC .... *G06K 19/07749* (2013.01); *G06K 19/07722* (2013.01); *H01L 2224/48091* (2013.01); *H01L 2224/48227* (2013.01); *H01L 2224/48228* (2013.01); *H01L 2224/49109* (2013.01); *B42D 25/00* (2013.01)
  USPC ............................ 235/488; 235/380; 235/492

(58) Field of Classification Search
  CPC ....... G06K 19/00; G06K 19/16; G06K 19/02; G06K 7/08; G06K 5/00; G06K 17/00; G06K 19/07749; G06K 19/07779; G06K 19/07745; G06K 19/07722; G06K 19/0775
  USPC ......... 235/488, 380, 492, 493, 487, 449, 451, 235/375
  See application file for complete search history.

(56) References Cited

U.S. PATENT DOCUMENTS

| | | | |
|---|---|---|---|
| 5,962,840 A * | 10/1999 | Haghiri-Tehrani et al. | ... 235/492 |
| 2003/0024995 A1 * | 2/2003 | Conner et al. | ................ 235/492 |
| 2008/0203172 A1 | 8/2008 | Berardi et al. | ................ 235/492 |

FOREIGN PATENT DOCUMENTS

| | | |
|---|---|---|
| DE | 43 28 469 | 3/1995 |
| DE | 298 04 833 | 7/1998 |

* cited by examiner

*Primary Examiner* — Edwyn Labaze
(74) *Attorney, Agent, or Firm* — James C. Lydon

(57) ABSTRACT

A multilayer contactless smartcard 10 including an electronic chip embedded in the card, the chip being connected to an antenna 22 printed on a carrier layer 20, and two card bodies, one on each side of the carrier, each including at least one plastic layer 40 and 60. The antenna carrier is opaque and includes a first cut-out forming a void 23 filled with a transparent plastic; and the plastic layers of the two card bodies each include a second cut-out forming two identical voids 43 and 63 the outlines of which superimpose, in order to make a transparent zone appear in the thickness of the card, forming a transparent logo in the shape of the cut-out. A process for manufacturing such a card is also disclosed.

12 Claims, 1 Drawing Sheet

PROCESS FOR MANUFACTURING A CONTACTLESS SMARTCARD HAVING A TRANSPARENT LOGO

The present invention relates to the field of contactless smartcards and to their manufacturing processes, and it more particularly relates to a contactless smartcard having a transparent logo and its manufacturing process.

The invention is applicable to any type of contactless smartcard, independently of the size and shape of the card. The invention also relates to hybrid contact/contactless cards. In the rest of the description the expression "contactless smartcard" will be understood to mean both hybrid contact/contactless smartcards and purely contactless smartcards.

Information exchange between a contactless card and the associated reading device is achieved via remote electromagnetic coupling of an antenna housed in the contactless card and a second antenna located in a reader. In order to produce, store and process the information, the card is equipped with a chip or an electronic module that is connected to the antenna. In the case of hybrid smartcards, the electronic chip is incorporated into a casing that acts as a contact electronic module. This module is inserted into a cavity produced in the card so that the electrical contacts of the module lie flush with, and are therefore accessible on, the surface of the card. Contactless smartcards are manufactured by joining a number of layers to one another, one of which serves as a carrier for the antenna. The layers are joined to one another by lamination, i.e. under elevated pressure and temperature conditions. The antenna may be produced in various ways, for example via screen printing of a conductive ink, via chemical etching of aluminium or copper, or via coils of a copper wire.

Production of a contactless card with a transparent through-logo i.e. one that allows the card to be seen through, requires all the constituent layers of the card to be modified. An existing solution consists in using transparent layers and then printing over the back and front side of the card except in the location of the logo, in order to make the card opaque outside of the zone that it is desired to leave transparent. This technique is well suited to contactless cards with etched or coiled antennae. However, this technique poses a problem as regards the opacity of the card since the dark-coloured antenna can be seen through the body of the finished card, and this is even more true when the antenna is printed.

To manufacture antennae, the applicant uses screen printing of a silver-particle-containing ink. Relative to the etching or coiling technique, this technique places specific constraints on the choice of the material used for the carrier layer of the antenna as this layer must allow the screen-printing and lamination steps to be carried out while guaranteeing the electrical integrity and mechanical strength of the antenna. Unsatisfactory results are obtained when an antenna is printed on a layer made of a transparent material. Specifically, during the lamination step, because of the high pressure and temperature used, the material of the transparent layer may flow by a substantial amount, causing the form factor of the antenna to change. Since the conductive ink from which the antenna is formed contains only 15% binder, the antenna is not strong enough, under temperature and pressure conditions of about 180° C. and 28 bars, to prevent the electrical parameters (inductance and resistance) of the antenna from varying, and this variation causes malfunctions. Furthermore, it is not rare for the antenna to rupture in regions of high shear stresses.

For this reason, the aim of the invention is to provide a contactless card with a transparent logo and the process for producing the card, which card and process remedy the aforementioned drawbacks.

Another aim of the invention is to provide a process for manufacturing a contactless card with a transparent logo, which process both guarantees that the card will be highly reliable in use, and makes it possible to achieve a high production yield i.e. of the same order as that achieved for contactless cards without a logo.

One subject of the invention is therefore a multilayer contactless smartcard comprising an electronic chip set or embedded in the card, the chip being connected to an antenna printed on a carrier layer, and two card bodies, one on each side of said carrier, each consisting of at least one plastic layer. According to the main features of the invention, the antenna carrier is opaque and comprises a first cut-out forming a void filled with a transparent plastic; and the plastic layers of the two card bodies each comprise a second cut-out forming two identical voids the outlines of which superpose, in order to make a transparent zone appear in the thickness of the card, forming a transparent logo in the shape of the cut-out.

The aims, objects and features of the invention will become more clearly apparent on reading the following description given with reference to the appended drawings, in which.

Figure 1:
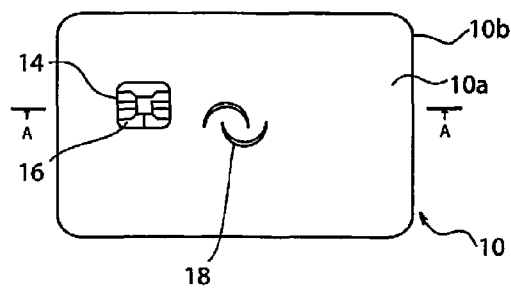
FIG. 1 shows a front view of the contactless smartcard produced with the process of the invention.

In the preferred embodiment of the invention the card obtained by the process of the invention is a hybrid contactless smartcard. This type of card is also called a dual-interface card because it comprises two different interfaces for communicating with a reading device. This card is denoted by the reference 10 in FIG. 1 and comprises a front side 10a and a back side 10b. The card comprises an electronic module 14 comprising electrical contacts 16 flush with the front side 10a of the card 10. The card 10 also comprises a logo 18. The shape of the logo 18 is not limited to that shown in the figure but may be any shape without departing from the scope of the invention. The essential feature of the logo 18 lies in the fact that it is transparent. The logo 18 is transparent from one side of the card 10 to the other, so that the entire thickness of the card is transparent in the location of the logo.

Figure 2:
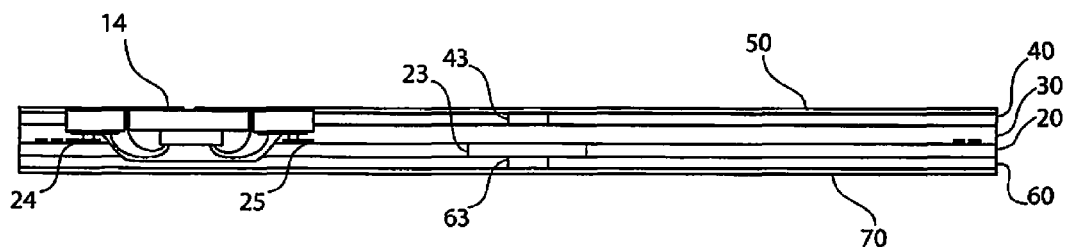
FIG. 2 shows a cross section through the card in FIG. 1 along the line A-A in the same figure.
Figure 3:
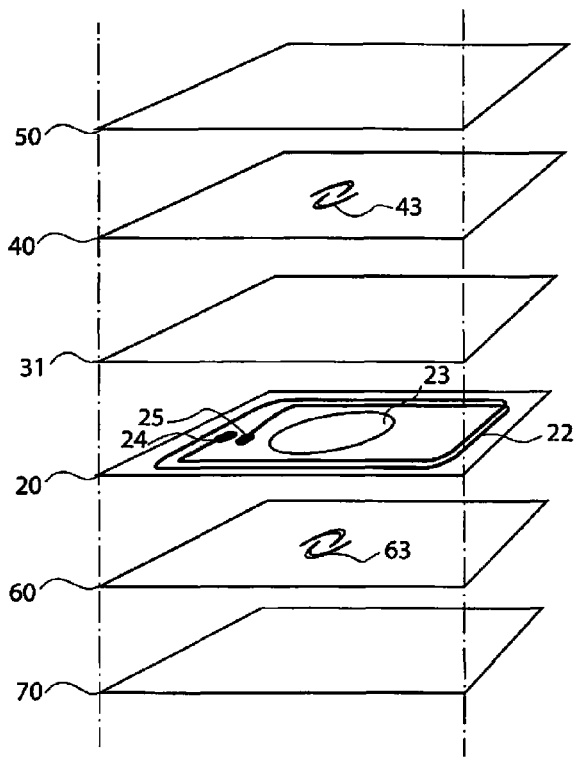
FIG. 3 shows a perspective view of the various constituent layers of the card according to the process of the invention.

This result is obtained by virtue of a manufacturing process described in detail in the rest of the description and with reference to FIGS. 2 and 3, which show details of the various constituent layers of the card 10. These layers are superposed before being joined to one another by hot pressing in two lamination steps. The various constituent layers of the card are generally provided in the form of strips of constant width, these strips possibly containing one or more cards in their width and preferably 3 or 5 cards. The length of the strips is fixed in order to form sheets intended for the manufacture of 24 cards in general, but they could be of any length or take the form of rolls without departing from the scope of the invention. The cards may also be manufactured individually.

The process is described with reference to FIGS. 2 and 3, FIG. 2 showing the card in FIG. 1 in cross section along the line A-A. The structure of the cards therefore comprises, starting from the first layer on the front side of the card and proceeding towards the back side: a coating layer 50 made of a transparent material, a printing layer 40 comprising a cut-out 43 in the shape of the logo 18, an intermediate layer 31, an antenna carrier layer 20 comprising a void 23, a printing layer 60 comprising a cut-out 63 in the shape of the logo 18, and a coating layer 70 made of a transparent material.

The first step of the process consists in preparing the antenna carrier layer 20 in a strip of an opaque non-flowable material, i.e. one that will not deform during the lamination step. The layer 20 is preferably made of a synthetic paper such as Teslin. Teslin is a synthetic material made of a single unorientated layer of a polymer such as polyethylene or polypropylene containing mineral fillers in an amount between 40 and 80%. It has the property of not flowing at the temperatures reached during the lamination and therefore of suffering no damage that could compromise the mechanical strength of the antenna on its carrier. The antenna carrier 20 could also be made of paper, which also has the property of not flowing at the temperatures reached during lamination. The antenna carrier may also be made of a polyester such as polyethylene terephthalate (PET). The thickness of the layer 20 is comprised between 160 and 200 µm and is preferably equal to 180 µm.

Next, cut-outs are produced in the strip forming the carrier layer at regular intervals in order to form voids 23. Throughout the description, the term "void" is understood to mean a through-cavity. The void 23 does not have sharp but only rounded edges and it is preferably an ellipse. The size of the void 23 is such that when the logo is superposed on it, the entire area of the logo is contained inside the cavity.

The second step consists in printing an antenna 22 around each void 23. The antenna 22 comprises at least one turn and two connection pads 24 and 25. The printing technique used is preferably a screen-printing technique but could be an offset-printing technique, a gravure-printing technique or a flexographic printing technique without departing from the scope of the invention. The layer 20 is the same size as the card 10.

The third step consists in preparing a filling element in a strip made of a plastic such as PVC or transparent PEGT. This filling element is a layer 31 that is the same size as the carrier layer 20. It does not contain a void. Its thickness is comprised between 150 and 250 µm and is preferably equal to 200 µm.

The fourth step consists in superposing the layer 31 on the antenna carrier layer 20 on the antenna side.

The fifth step is a lamination step that consists in subjecting the two layers 20 and 31 to a heat treatment under pressure. Under the combined action of the heat and pressure, the plastic layer 31 softens and adheres to the layer 20. In addition, on softening the material of the layer 31 fills the void 23 in the carrier layer 20. The semi-finished product obtained is the inlay of the smartcard. The inlay has a constant thickness over its entire area and comprises a transparent window. The antenna imprisoned in the transparent plastic of the layer 31 is embedded in the inlay.

The sixth step consists in preparing two printing layers 40 and 60, each forming part of the two card bodies placed one on each side of the inlay obtained in the preceding step, respectively. The features of the two card bodies are described below. The printing layers 40 and 60 are made of PET and are preferably covered with a coating layer made of PVC or transparent PEGT. The first printing layer 40 has a thickness comprised between 135 µm and 165 µm and preferably equal to 150 µm. The first printing layer 40 is covered with a coating layer 50. Likewise, the second printing layer 60 has a thickness comprised between 135 and 165 µm, and preferably equal to 150 µm. The second printing layer 60 is covered with a coating layer 70. Each printing layer 40 and 60 is drilled with a cut-out, 43 and 63, respectively, having the shape of the logo 18. The cut-outs 43 and 63 are located in a set location in their respective layer so that they perfectly superpose edge to edge when the constituent layers of the card are joined to one another. Preferably, the cut-outs 43 and 63 are produced simultaneously in order to be perfectly identical. The printing layers 40 and 60, corresponding to the front side and back side of the card, respectively, are printed, beforehand, on their external face, with the personalised graphics of the card.

The seventh step consists in depositing the first printing layer 40 on the inlay on the antenna side, therefore on the filling layer 31, and in depositing the second printing layer 60 on the antenna carrier layer 20 on the face opposite that which carries the antenna.

The eighth step consists in depositing a first coating layer 50 on the printing layer 40 and a second coating layer 70 on the printing layer 60, the two coating layers 50 and 70 being prepared from two strips of transparent plastic material.

The two card bodies located on either side of the inlay obtained in the fifth step are each composed of the following layers: the layers 31, 40 and 50 for the card body located on the front side, and the layers 60 and 70 for the card body located on the back side.

The ninth step is a lamination step. It consists in subjecting the sandwich composed of the layers 50, 40, of the inlay (itself composed of the layers 20 and 31) and of the layers 60 and 70 to a heat treatment under pressure. Under the combined action of the heat and pressure, the various plastic layers soften and weld to one another. On softening, the plastic material of the coating layers 50 and 70 fills the cut-outs 43 and 63 in the printing layers and 60, respectively. The plastic materials of the coating layers 50 and 70 weld to each another inside the cut-outs 43 and 63. In order for this weld to be invisible and perfect, it is necessary for the material of the filling layer 31 to be compatible with the material of the coating layers 50 and 70. Preferably, these two materials are identical in order to be perfectly compatible.

The strips of cards obtained by the process are then cut out in order to extract the individual cards.

In the case of the manufacture of a hybrid contactless smartcard, the last step consists in setting the electronic module in the card while connecting it to the antenna. As is known, this consists in countersinking a cavity in the card in order to expose the connection pads of the antenna, and then in adhesively bonding the module in order to seal it in the card and simultaneously connect it electrically to the antenna pads.

In the case of a smartcard that is purely contactless, the last step does not exist since the chip is embedded in the card. Specifically, for this type of card, the chip is directly connected to the connection pads of the antenna by way of what is called a flip-chip connection, after the step of printing the antenna.

The invention claimed is:

1. Multilayer contactless smartcard (10) comprising an electronic chip embedded in the card, the chip being connected to an antenna (22) printed on an opaque antenna carrier layer (20), and two card bodies, one on each side of said opaque antenna carrier layer, each comprising at least one plastic layer, the opaque antenna carrier layer further comprising a first cut-out forming a void (23) filled with a transparent plastic;

the plastic layers of the two card bodies each comprising a second cut-out forming two identical voids (43 and 63) the outlines of which superimpose, such that a transparent zone is formed in the thickness of the card, forming a transparent logo (18) in the shape of said second cut-outs.

2. The multilayer smartcard of claim 1, wherein said card is a hybrid contactless smartcard.

3. The multilayer smartcard of claim 1, wherein said card is exclusively contactless.

4. Process for manufacturing a contactless smartcard comprising:
- preparing an antenna carrier layer (20) in a strip of a non-flowable material, and producing cut-outs at suitable intervals in order to form voids (23);
- producing an antenna (22), around the voids (23) thus formed, by printing, with a conductive ink, on said carrier layer, at least one turn and two connection pads (24 and 25);
- preparing a filling layer (31) in a strip of a plastic;
- superposing the filling layer (31) on the carrier layer (20) on the same side as the antenna (22);
- laminating the layers (20 and 31) together by a heat treatment under pressure in order to obtain an inlay;
- preparing two printing layers (40 and 60), corresponding to the front side and back side of the card, respectively, from two plastic strips by printing, on one of their faces, graphics personalized to the card, and by producing cut-outs (43) and (63), of identical size and shape, the location of said cut-outs (43) and (63) in the first and second printing layers (40) and (60) being set so that their outlines superimpose exactly once the layers of the card have been joined together;
- depositing the first printing layer (40) on the inlay on the antenna side and therefore on the filling layer (31), depositing the second printing layer (60) on the antenna carrier layer (20) on the face opposite that which carries the antenna in order to place the graphics on the exterior;
- depositing a first coating layer (50) on the first printing layer (40), and a second coating layer (70) on the second printing layer (60), the two coating layers (50 and 70) being prepared from two strips of transparent plastic material; and
- laminating said two printing layers (40 and 60), said two coating layers (50 and 70) and said inlay together, in order to weld them to one another by hot pressing.

5. The manufacturing process of claim 4, wherein the plastic used to prepare filling layer (31) is a strip of PVC or transparent PEGT.

6. The manufacturing process of claim 4, further comprising
the step of printing the antenna is followed by a step of connecting an electronic chip to the connection pads (24 and 25) of the antenna, such that the cards manufactured are purely contactless smartcards.

7. The manufacturing process of claim 4, further comprising:
- countersinking a cavity in the card in order to expose said connection pads (24 and 25) of the antenna; and
- adhesively bonding a module containing an electronic chip in order to seal it in the card and simultaneously connect it electrically to said antenna pads, such that the cards manufactured are hybrid contactless smartcards.

8. The manufacturing process of claim 4, wherein the material of said filling layer (31) is identical to that of said coating layers (50 and 70), in order to be perfectly compatible with one another.

9. The manufacturing process of claim 4, wherein said antenna carrier layer (20) is made of a synthetic paper.

10. The manufacturing process of claim 4, wherein said antenna carrier layer (20) is made of a polyester.

11. The manufacturing process of claim 10, wherein said polyester is PET.

12. The manufacturing process of claim 4, in which said cut-outs (43 and 63) in said printing layers (40 and 60) are produced simultaneously.

* * * * *